(12) United States Patent
Feroli (10) Patent No.: US 7,784,146 B2
(45) Date of Patent: Aug. 31, 2010

(54) PROBE TIP CLEANING APPARATUS AND METHOD OF USE

(75) Inventor: Ronald A. Feroli, Walden, NY (US)

(73) Assignee: International Business Machines Corporation, Armonk, NY (US)

( * ) Notice: Subject to any disclaimer, the term of this patent is extended or adjusted under 35 U.S.C. 154(b) by 1152 days.

(21) Appl. No.: 11/306,720

(22) Filed: Jan. 9, 2006

(65) Prior Publication Data

US 2008/0184505 A1   Aug. 7, 2008

(51) Int. Cl.
*A47L 5/00* (2006.01)
*B08B 11/00* (2006.01)

(52) U.S. Cl. ........................................ 15/310; 15/210.1

(58) Field of Classification Search ................... 15/310, 15/21.1, 210.1; 451/183, 296
See application file for complete search history.

(56) References Cited

U.S. PATENT DOCUMENTS

| | | | |
|---|---|---|---|
| 4,590,422 A | 5/1986 | Milligan | |
| 5,728,229 A * | 3/1998 | Despres | 134/32 |
| 5,735,010 A | 4/1998 | Burner et al. | |
| 5,916,010 A | 6/1999 | Varian et al. | |
| 6,027,399 A | 2/2000 | Stewart | |
| 6,056,627 A * | 5/2000 | Mizuta | 451/59 |
| 6,257,958 B1 * | 7/2001 | Angell et al. | 451/9 |
| 6,306,187 B1 * | 10/2001 | Maeda et al. | 51/298 |
| 6,604,988 B2 * | 8/2003 | Talieh et al. | 451/59 |
| 6,659,849 B1 * | 12/2003 | Li et al. | 451/72 |
| 6,741,086 B2 | 5/2004 | Maekawa et al. | |
| 6,817,052 B2 | 11/2004 | Grube | |
| 6,840,374 B2 * | 1/2005 | Khandros et al. | 206/223 |
| 6,884,300 B2 * | 4/2005 | Sato et al. | 134/6 |
| 6,887,136 B2 * | 5/2005 | Smith | 451/57 |
| 6,960,123 B2 * | 11/2005 | Mitarai | 451/314 |
| 7,104,875 B2 * | 9/2006 | Birang et al. | 451/296 |
| 7,254,861 B2 * | 8/2007 | Morioka et al. | 15/218.1 |
| 2004/0209559 A1 * | 10/2004 | Birang et al. | 451/285 |
| 2005/0001645 A1 | 1/2005 | Humphrey et al. | |
| 2005/0084315 A1 * | 4/2005 | Lodwig et al. | 400/701 |
| 2007/0178814 A1 * | 8/2007 | Sato et al. | 451/49 |

FOREIGN PATENT DOCUMENTS

| | | |
|---|---|---|
| JP | 11345846 | 12/1999 |
| JP | 2004317272 | 11/2004 |
| JP | 2004340629 | 12/2004 |

\* cited by examiner

*Primary Examiner*—David B Thomas
(74) *Attorney, Agent, or Firm*—Joseph P. Abate; Roberts Mlotkowski Safran & Cole, P.C.

(57) ABSTRACT

Apparatus for the method, including cartridges for housing strips of cleaning pad material, are provided. A method for cleaning probe tips, e.g., on a probe card, comprises abrading the probe tips on an abrasive surface, and advancing the abrasive surface so that a later cleaning cycle uses a clean portion of the cleaning pad. The method may include use of a vacuum to aspirate material dislodged by the abrading. In another aspect, a method for cleaning probe tips includes brushing the probe tips and operating a vacuum to aspirate material from the probe tips and/or brush. The methods may be used singly or in combination.

20 Claims, 9 Drawing Sheets

PROBE TIP CLEANING APPARATUS AND METHOD OF USE

The invention generally relates to probes of the type used for testing semiconductor devices, and more particularly to an apparatus for cleaning probe tips and a method of use.

BACKGROUND DESCRIPTION

Increasing and more difficult challenges are being placed on electrical test probing, especially wafer probing. Advances in semiconductor technology, such as increased I/O count, tighter geometries, and higher numbers of dies per wafer are leading to a need for improvements in test probe methods and apparatuses. Improvements are needed in, among other places, probe tip reliability and usage.

Probe cards are used to test electronic devices at the wafer level. Repeated use typically results in a buildup of debris collected from the wafer surface, generally including hardmask material, which can result in poor or no electrical contact, resulting in an incorrect identification of the device under test as a failing device. Thus, probes on the cards need to be cleaned regularly, and if this is not done, then electrical measurements can be greatly affected.

Current art has the probes, after a specified number of test operations (or "touchdowns"), placed against a rough or abrasive pad and "scrubbed" to clean the tips. This scrubbing transfers the debris from the probe tip to the cleaning material. In order for the tips to be properly cleaned, the next time a scrubbing operation is required, the probes are placed in a "clean" spot on the pad to prevent picking up debris from a previous scrub. This general process continues until the wafer prober has completed scrubbing on the entire available pad area, at which point the prober is "reindexed" to the first location on the pad, and continues to reuse the pad until it is changed.

While it is possible for the prober to indicate that a new cleaning pad is required, even if it is indicated, there is no requirement that the pad actually be changed. Moreover, changing the cleaning pad is a time and labor intensive effort, during which the wafer prober is not operative, and products are not being tested.

Also, it is known that scrubbing alone might not be sufficient, because after scrubbing, debris might still cling to the probe tips. A prober may, therefore, be equipped with a brush that the probes are inserted into and removed, thereby removing debris from the probes. However, debris remains in the brush, and can actually be transferred back onto the probes the next time they are inserted. Thus, the brush needs to be periodically removed and cleaned or replaced.

In addition to cleaning pads with abrasive material, cleaning pads with adhesive films or gels are also known. When such materials are used, the probe tips are generally "dipped" into the cleaning pad, rather than scrubbed across the surface, and loose contaminant particles are intended to be retained in the adhesive or gel. Such adhesive and/or gel materials can transfer to the probes, and, in turn, to the wafers, both of which are undesirable.

SUMMARY OF THE INVENTION

In a first aspect of the invention, a cartridge comprises a cleaning pad, a cleaning pad supply portion, and a cleaning pad take-up portion, the cartridge being designed and configured to fit into a cleaning portion of a probe test apparatus.

In another aspect of the invention, the invention provides a probe cleaning apparatus comprising a cleaning pad supply portion and a cleaning pad take-up portion. The cleaning pad is wound at least on the cleaning pad supply portion and dispensed in the cleaning pad take-up portion during use. A scrubber vacuum is positioned and arranged to aspirate material dislodged by the cleaning pad. A backing surface is provided, having at least a portion adjacent to the cleaning pad.

In an aspect, the invention provides a method of cleaning a probe tip comprising contacting a probe tip with a surface of a cleaning pad, abrading the probe tip with the cleaning pad, and advancing the cleaning pad in a direction parallel to the surface of the cleaning pad. In aspects, the method also includes operating a scrubber vacuum positioned and arranged to aspirate material dislodged by the abrading.

DETAILED DESCRIPTION OF EMBODIMENTS OF THE INVENTION

The invention provides methods and apparatus for cleaning probes of the type used for testing semiconductor devices and more particularly to a probe cleaning apparatus and method for cleaning probes. In aspects, the invention includes a cleaning surface which can be advanced or indexed, thus ensuring that the probe tips are properly cleaned on a cleaning surface. By advancing the cleaning surface in a next cleaning cycle, a new portion of the cleaning surface is used. The present invention, by employing a cleaning pad that can be advanced, permits use of much larger cleaning pads, e.g., abrasive cleaning pads. This permits longer use of the probe apparatus before the cleaning pad needs to be changed.

In aspects, the invention also provides a scrubber vacuum which is positioned and arranged to aspirate material dislodged when the probes are cleaned on the cleaning pad. An advantage of the scrubber vacuum is that it removes potentially contaminating material from the cleaning site. This can lessen the likelihood that material dislodged during a cleaning might contaminate the probes during the same or a later cleaning cycle.

Figure 1:
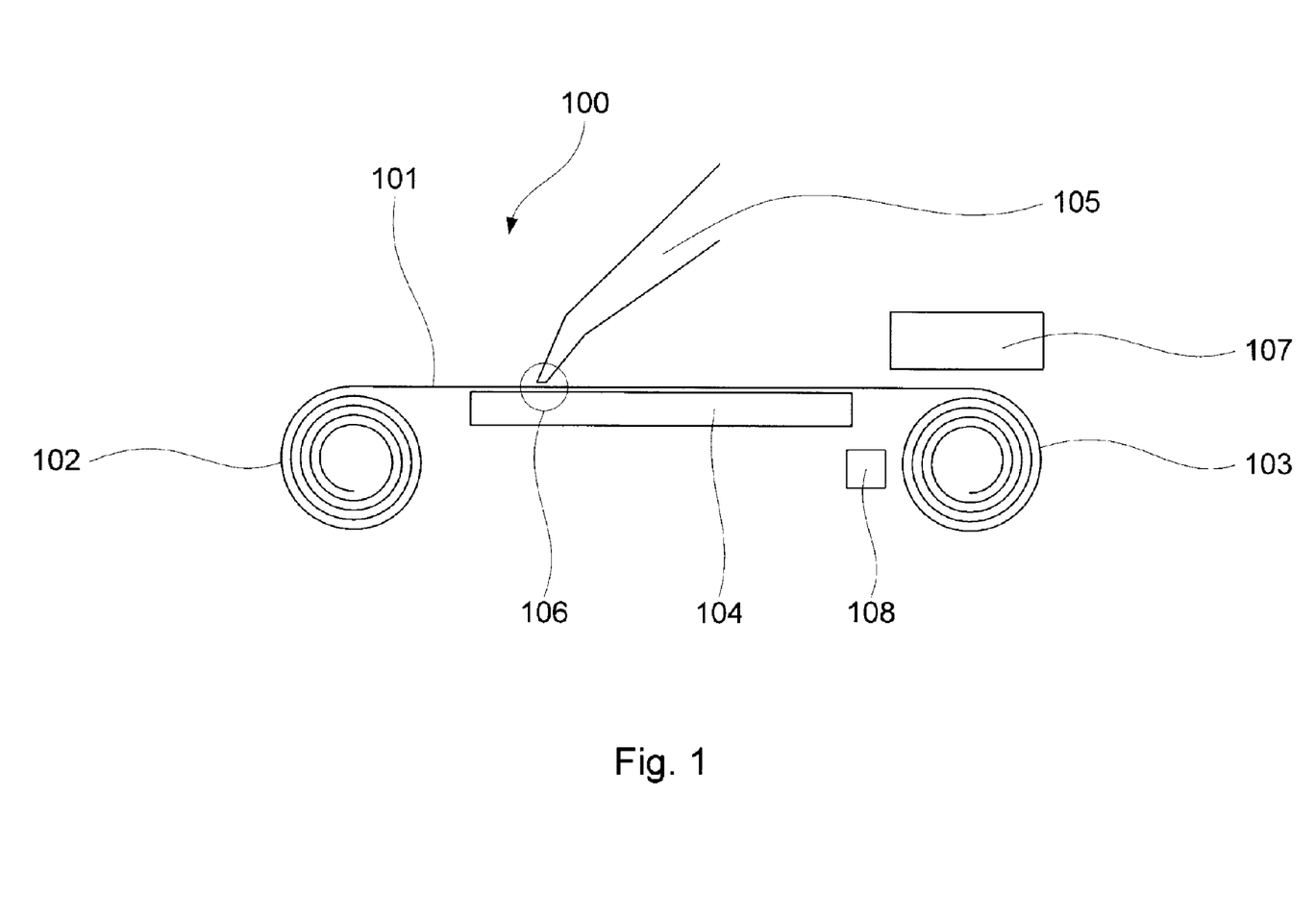
FIG. 1 is a side view of a probe tip cleaning apparatus in accordance with the invention.

FIG. 1 shows an apparatus of the invention, generally denoted as reference numeral 100. The apparatus 100 includes cleaning pad 101 being drawn from pad supply 102 to pad take-up 103, via a motor 108. That is, in aspects of the invention, cleaning pad 101 is advanced by means of a drive motor, generally denoted at reference numeral 108, which may be controlled by software in the wafer prober.

A backing surface 104 provides a surface for the cleaning pad 101, and is adjacent thereto. The cleaning pad 101 is positioned to be between probe tip 105 and backing surface 104. Probe tip 105 is caused to contact cleaning pad 101, typically by bringing the cleaning pad surface to the probe card (not shown). At least in the vicinity of contact 106, cleaning pad 101 and backing surface 104 are substantially flat or planar.

As cleaning pad 101 is brought into contact with probe tip 105, probe tip 105 is slightly deflected, such that probe tip 105 is abraded, dislodging debris and/or other contaminants from the probe. It is also possible that debris and/or other contaminants are dislodged from cleaning pad 101, or are present in the air. In aspects, the method includes providing and using scrubber vacuum port 107 to aspirate and remove debris and/or contaminants, including, but not limited to, dislodged material, including material dislodged by abrading.

The cleaning pad 101 may be any surface suitable for cleaning probe tips. In aspects, the cleaning pad comprises an abrasive cleaning surface. In aspects, the cleaning pad comprises a flexible sheet that can be wound into a coil. When an abrasive cleaning pad is used, any appropriate sandpaper of appropriate materials and grits, as can be determined by those of ordinary skill in the art, can be used. Suitable abrasive materials for sandpaper include, but are not limited to, silicon carbide, tungsten carbide, aluminum oxide, and combinations thereof. Any appropriate grit, e.g., 5 μm silicon carbide, may be used.

The dimensions of the cleaning pad are not critical to the invention, and appropriate dimensions can be determined by those of ordinary skill in the art. The cleaning pad 101 may be of any length appropriate for a particular probing apparatus. In order to reduce the frequency of replacing the cleaning pad, it should be as long as possible, e.g., greater than or about 3 ft (about 1 m), greater than about 30 ft (about 10 m), greater than about 100 ft (about 30 m), greater than or about 150 ft (about 45 m), etc. The width of the cleaning pad is largely determined by the types of probe cards that the probing apparatus is designed to employ, and the probing apparatus in which the cleaning pad is to be used. In aspects, the cleaning pad is wider than about 0.5 inches, or wider than about 1 inch. In aspects, the cleaning pad is narrower than about 4 inches, or narrower than about 3 inches. For example, a cleaning pad may be about 1-3 inches wide.

Referring to FIG. 1, in further aspects, cleaning pad 101 is maintained flat against backing surface 104, at least in the vicinity of contact 106 between probe tip 105 and cleaning pad 101. This may be accomplished by any method by one of ordinary skill in the art.

Figure 2:
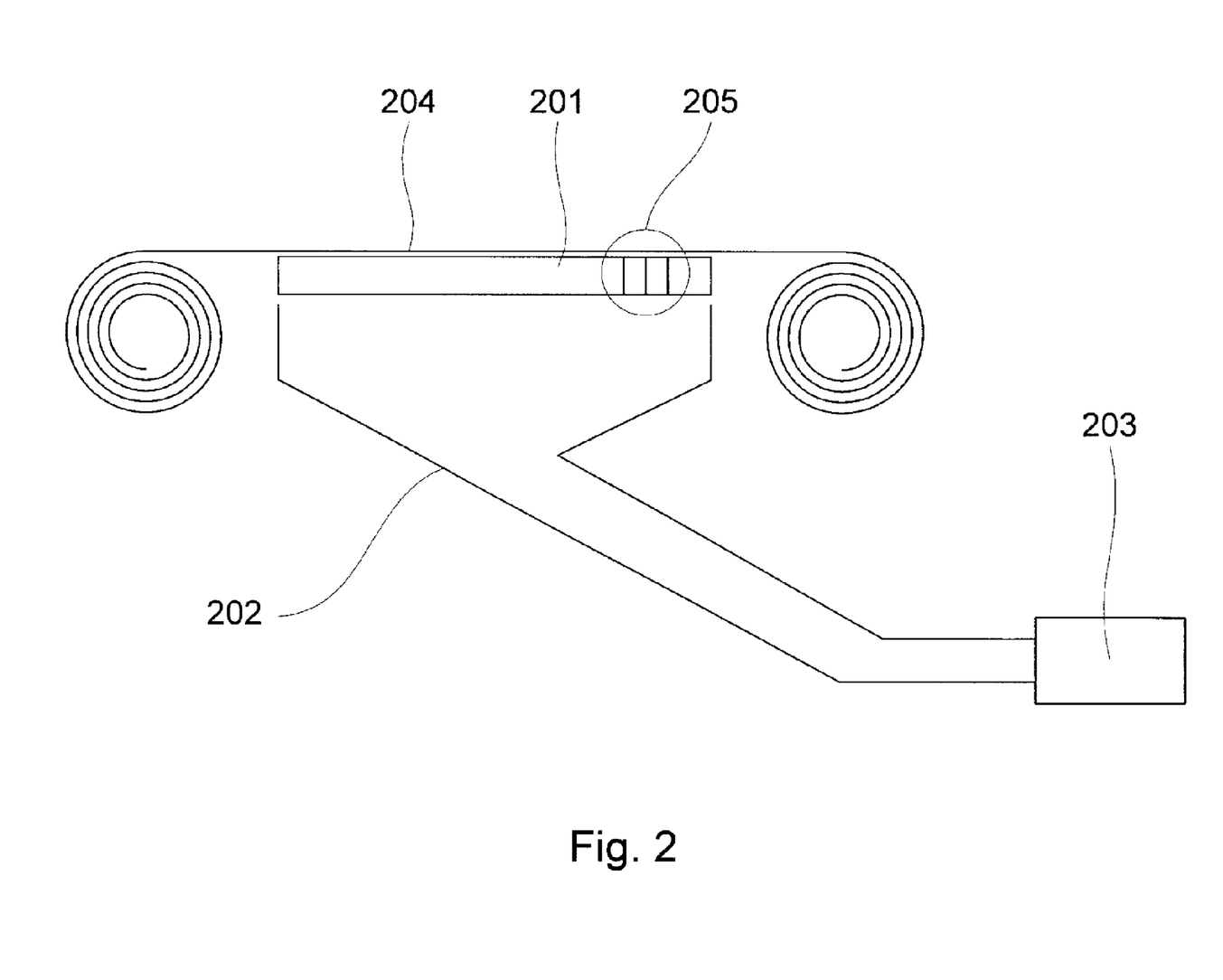
FIG. 2 is a side view showing a vacuum system for a probe tip cleaning apparatus in accordance with the invention.

Referring to FIG. 2, in aspects, this may be accomplished, for example, by means of a vacuum 203. When done by means of a vacuum, backing surface 201 may be provided with a plurality of openings 205 and connected via conduit 202 to vacuum 203 which is positioned and arranged to aspirate air through at least one of the plurality of openings 205. By operation of vacuum 203, cleaning pad 204 is drawn toward backing surface 201, and caused to lie substantially flat against the surface.

Figure 3:
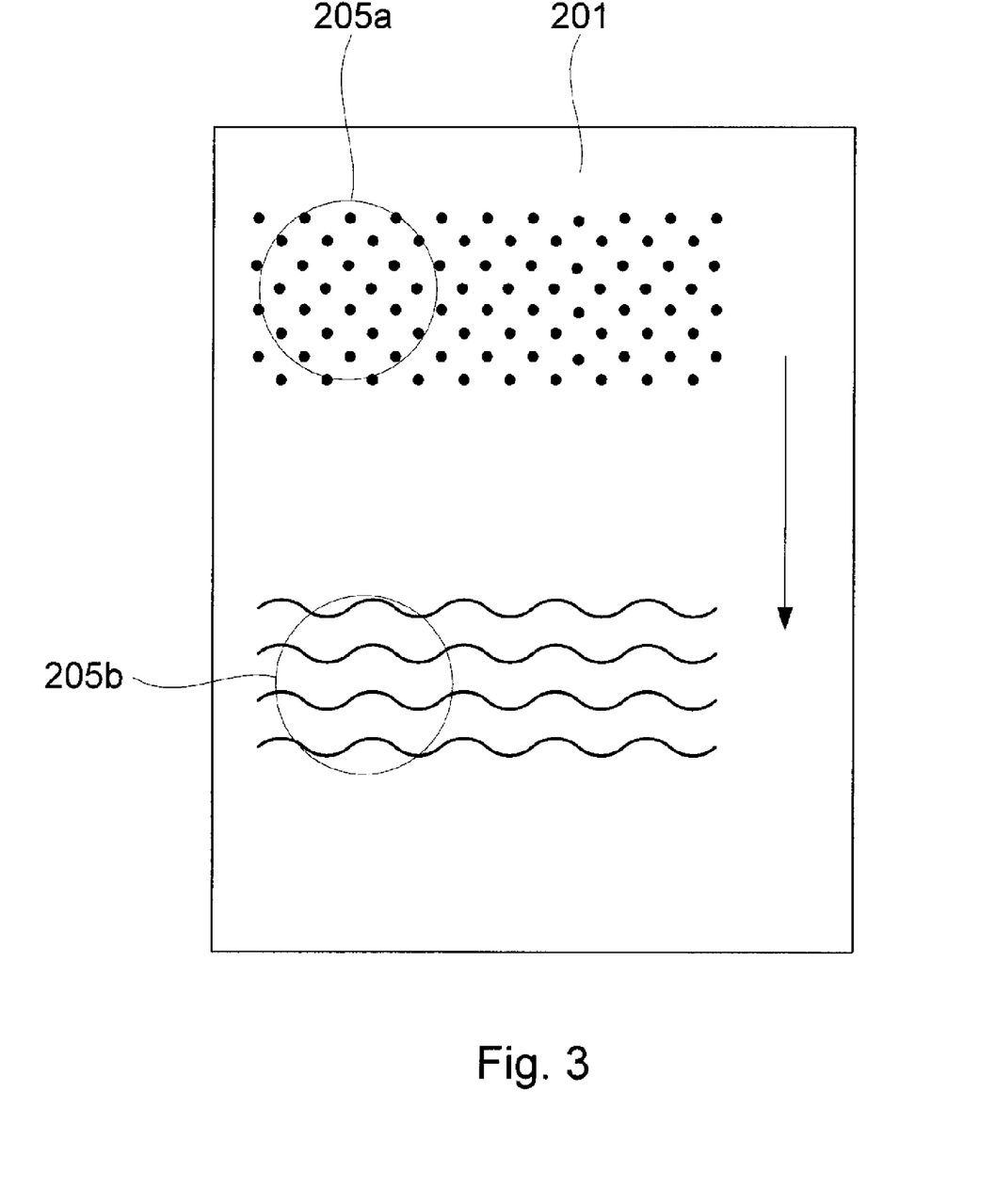
FIG. 3 is a top plan view of a backing surface in accordance with the invention.

FIG. 3 shows a representation of various opening patterns. The configuration, number, size, and pattern of openings in backing surface 201 for purposes of the vacuum can be determined by those of ordinary skill in the art using routine methods, and does not involve undue experimentation. By way of guidance, in aspects, openings are generally sufficiently smaller than the probe tips to reduce the possibility of puncturing the scrubbing pad. When the openings are holes, they are generally spaced more closely than the distance between adjacent probes on the probe card. This may help to assure proper flatness of the cleaning pad. Without limiting the present invention, two possible patterns for the openings are shown in FIG. 3, which shows a diamond lattice of holes 205a, and a series of slits 205b. In FIG. 3, the large arrow points in the direction of motion of the scrubbing pad when advanced.

The backing surface may be installed in any way by those of ordinary skill in the art. In aspects, the backing surface may be permanently or releasably attached to the probe apparatus or to a cartridge (discussed in more detail below). In practice, the openings, e.g., 205a and/or 205b, in the backing surface may get clogged over time. A backing surface that is releasably attached would permit cleaning the backing surface at appropriate intervals. In this vein, a backing surface that is permanently attached to a disposable or recyclable cartridge may not require cleaning at all (except, for a recyclable cartridge, during the recycling phase).

Figure 4:
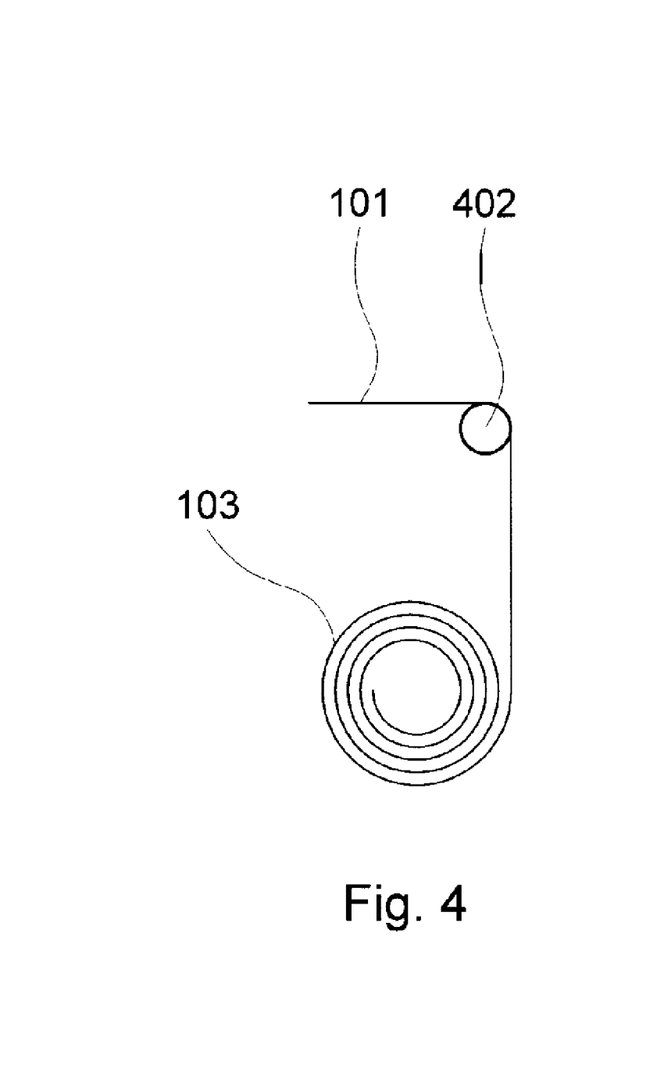
FIGS. 4 and 5 are alternate aspects of take-up portions of the apparatus in accordance with the invention.

On the take-up side, any apparatus designed by those of ordinary skill in the art can be used. As an example, FIG. 4 shows an apparatus in which the advancing of cleaning pad 101 over roller 402 is accomplished by turning spindle 103 via a motor (not shown) controlled by software in the wafer prober.

Figure 5:
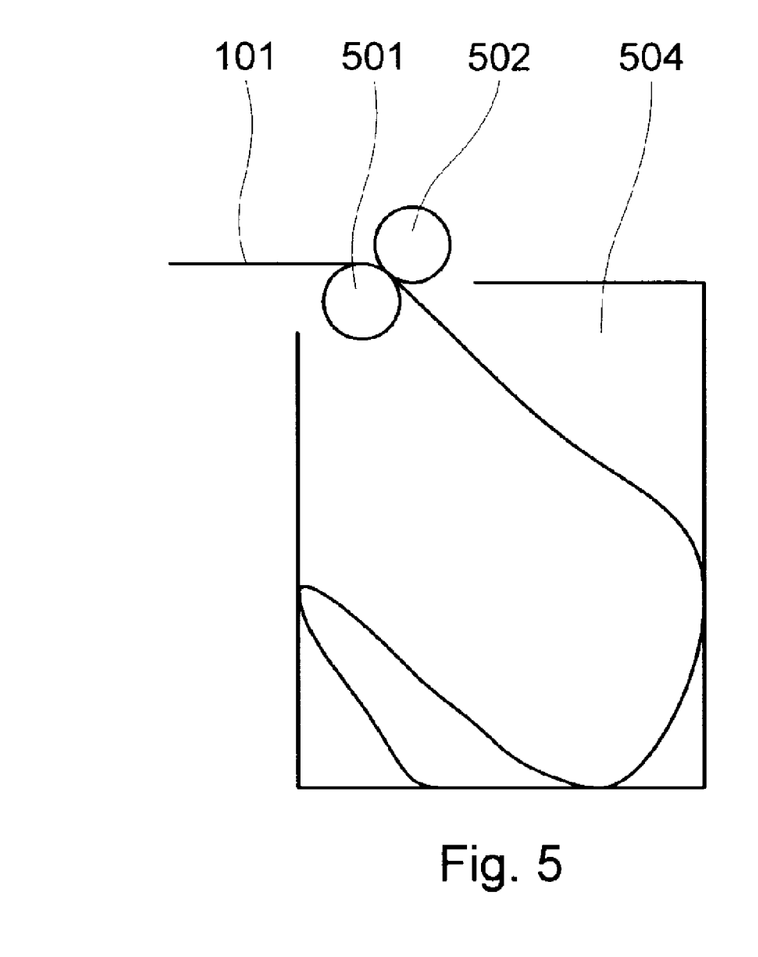

Also suitable is use of twin rollers 501 and 502 in FIG. 5, at least one of which is driven via a motor (not shown) controlled by software in the wafer prober. In the embodiment of FIG. 5, cleaning pad 101 is emptied into receptacle 504. If no spindle is used, as in FIG. 5, then the used cleaning pad may be forced to bend and wrinkle, which may help to prevent re-use of the soiled cleaning pad.

Another method of maintaining the cleaning pad substantially flat against the backing surface is to provide tension between the cleaning pad supply and take-up portions. The precise way in which this is done is not critical to the invention, and may be designed by those of ordinary skill in the art without undue experimentation. It will be understood that in order to maintain tension, tension may be applied to the cleaning pad in at least two locations, one on the cleaning pad supply side, and one on the cleaning pad take-up side. Any take-up apparatus, including, but not limited to, those shown in FIGS. 4 and 5, can be employed to provide tension on the take-up side.

Figure 6:
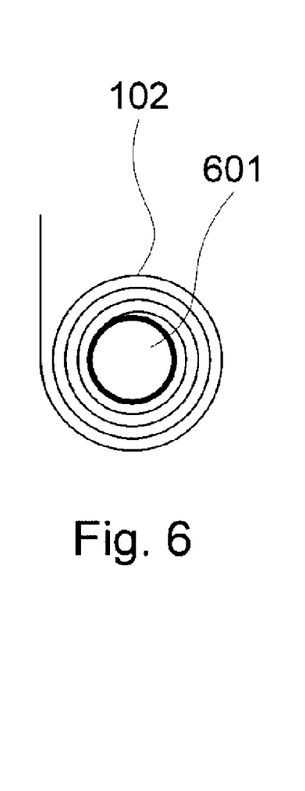
FIG. 6 is a side view of a spindle-type tension apparatus in accordance with the invention.
Figure 7:
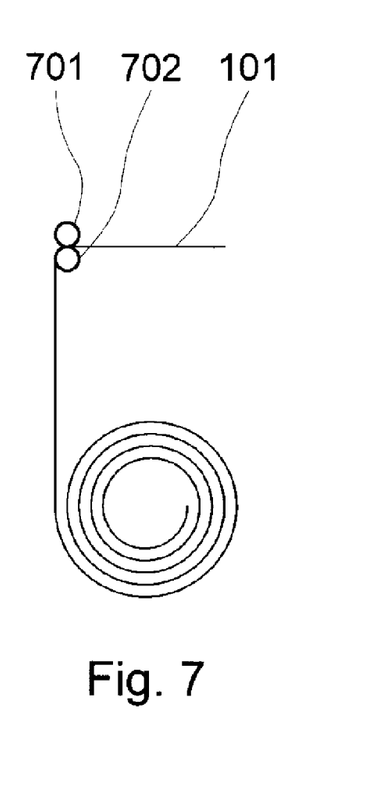
FIG. 7 is a side view of a twin-roller-type tension apparatus in accordance with the invention.
Figure 8:
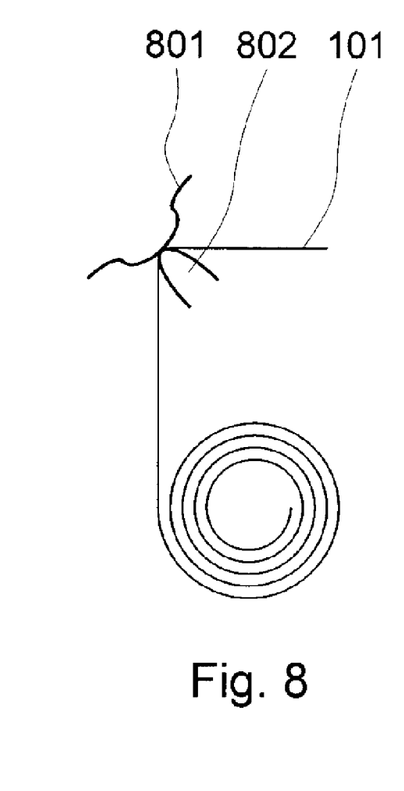
FIG. 8 is a side view of a pressure-type tension apparatus in accordance with the invention.

On the cleaning pad supply side, for purposes of illustration, some contemplated methods and apparatus are shown in FIGS. 6-8. As shown in FIG. 6, in one aspect, this may be done via spindle 601, on which cleaning pad 102 is wound. As shown in FIG. 7, in one aspect this may be done by a pair of rollers 701 and 702 to maintain a level of tension in cleaning pad 101. As shown in FIG. 8, non-rolling members (e.g., opposing fingers) 801 and 802 may also be used to effectively apply pressure, or squeeze, cleaning pad 101 to provide a level of tension. When a non-rolling surface 801 is used, it will be understood that it should comprise a material that is sufficiently hard not to be abraded onto the surface of cleaning pad 803, and/or comprise a material that, should it be abraded onto the cleaning pad, would not adversely affect probe cleaning. Such materials are readily determined by those of ordinary skill in the art.

Any combination of these and other methods of applying tension may be used. The precise amount of tension applied is not important; although, it will be understood that sufficient tension should be applied to keep the cleaning pad substantially flat, yet not so much tension to damage the cleaning pad or other apparatus components. Moreover, a method of maintaining tension may be used in combination with a backing surface vacuum.

In another aspect, the invention includes a method of cleaning probe tips with a brush. In this method, the use of a vacuum to aspirate contaminant particles removed from the probes and/or to clean the brush is contemplated by the invention.

Figure 9:
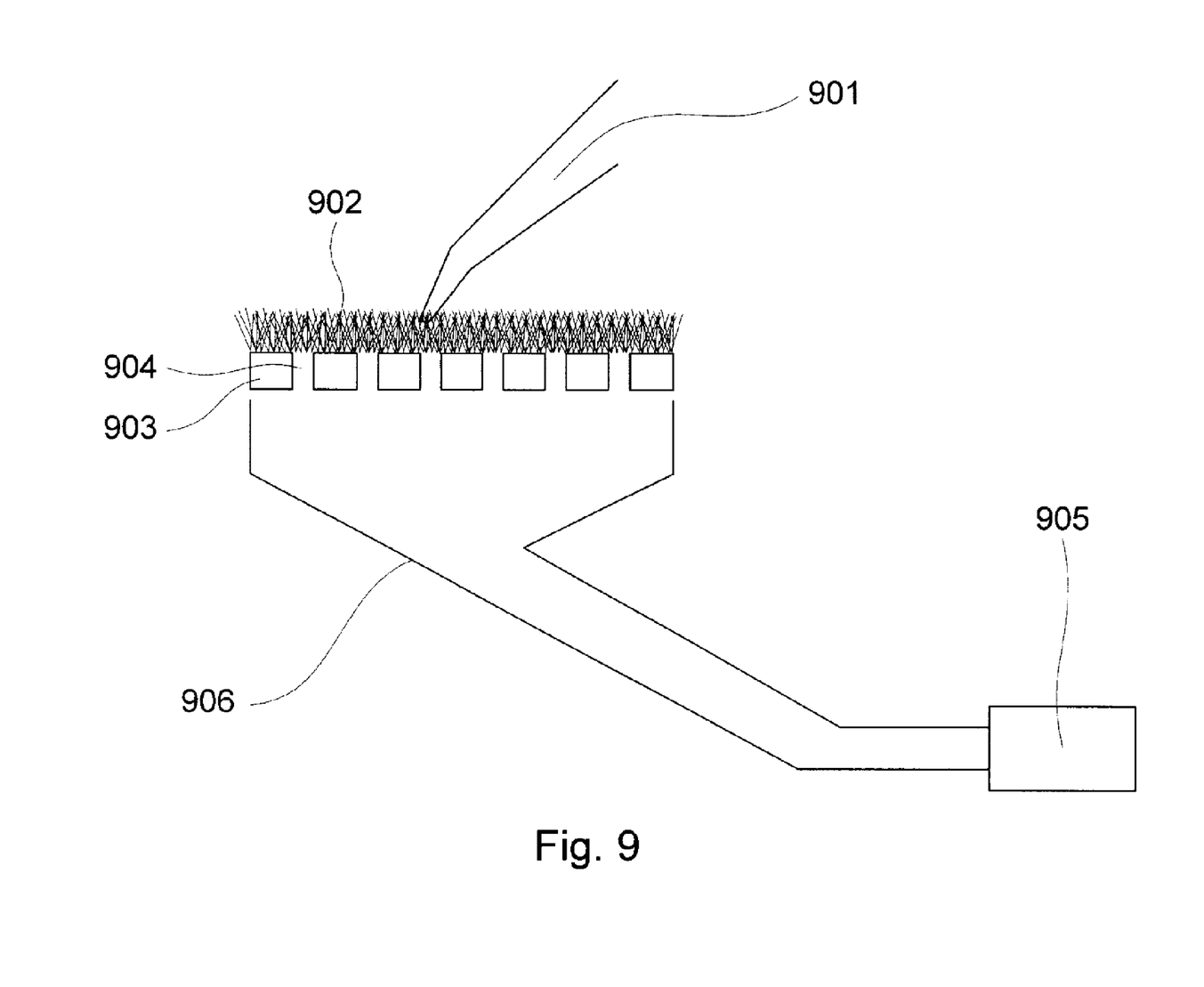
FIG. 9 is a schematic illustrating use of a vacuum in combination with a brush in accordance with the invention.

FIG. 9 schematically illustrates an aspect of this invention. Referring to FIG. 9, probe tip 901 is drawn through probe brush 902 in order to remove debris from the probe tip. Probe brush 902 is attached to brush substrate 903, which substrate is provided with a plurality of openings 904. Probe brush vacuum 905 is connected to probe brush vacuum conduit 906, which is connected to brush substrate 903 on the opposite side of probe brush 902. When probe tip 901 is contacted with probe brush 902, debris from the probe tip is deposited in the probe brush. Operating probe brush vacuum 905 causes material in the probe brush to be aspirated through openings 904, thereby removed.

Probe brushes that may be used with the present invention include probe brushes made of conventional materials and are familiar to those of ordinary skill in the art. Generally, probe brushes reach at least about 200 μm into the probe tip when removing debris.

In aspects, the probe brush vacuum 905 is operated simultaneously (e.g., completely or partially overlapping in time) with the brushing of the probe tip. In aspects, the probe brush vacuum 905 may be operated before or after the brushing of the probe, which vacuuming may be in addition to, or instead of, vacuuming simultaneous with the brushing. When the vacuuming and brushing are simultaneous, it is possible that the probe brush vacuum 905 assists the probe brush, thereby removing more debris from the probe tip than removed by brushing alone (without the probe brush vacuum).

The cleaning aspect of the present invention has been described separately from the brush vacuum aspect of the invention. Those of ordinary skill in the art will appreciate that a probe apparatus can employ either aspect of the invention without employing the other aspect. In an aspect of the invention, both methods are employed in a probe apparatus.

An aspect of the invention also includes a cartridge comprising at least the cleaning pad, pad supply, and pad take-up. Such a cartridge would make replacing the cleaning pad a more efficient process, leading to less downtime and more productivity of the wafer prober. In embodiments, the cartridge would contain more usable surface area of cleaning pad than current cleaning pads.

Figure 10:
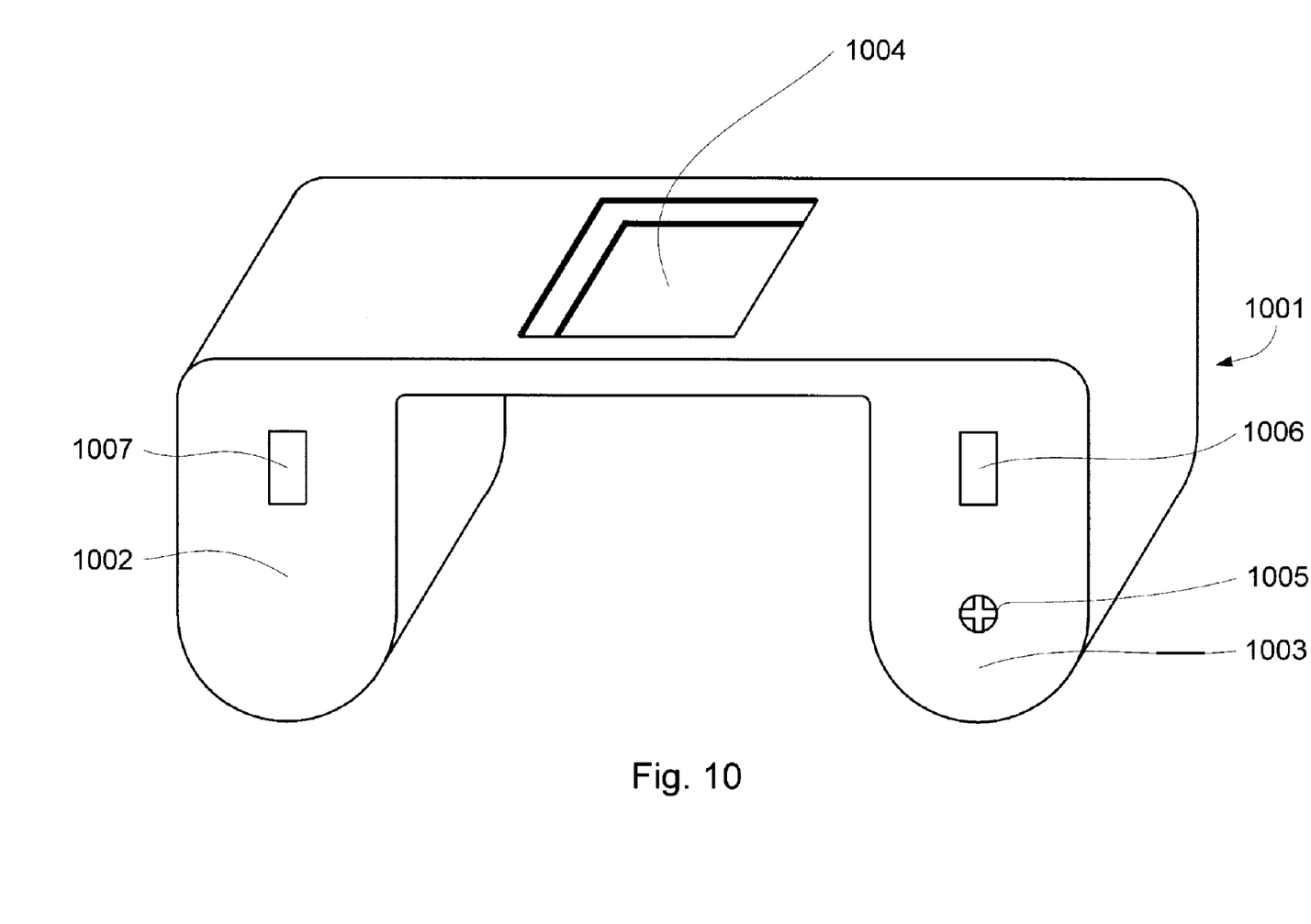
FIG. 10 is an exterior view of a cartridge in accordance with the invention.

A schematic side view of an embodiment of a cartridge is shown in FIG. 10. Referring to FIG. 10, cartridge 1001 comprises cleaning pad supply portion 1002, cleaning pad take-up portion 1003, and window 1004. The cleaning pad (not shown in FIG. 10) is initially loaded into cleaning pad supply portion 1002, threaded past window 1004, and secured in cleaning pad take-up portion 1003. In aspects, cartridge 1001 is provided with hooks or brackets, e.g., 1006 and 1007, to secure the cartridge to the probe apparatus.

When secured to the wafer prober, the cartridge may be connected to a drive motor (as described above) on the wafer prober that acts to advance the cleaning pad during operation. Where the cleaning pad is advanced by a spindle, for example, the drive motor may attach to the spindle at spindle attachment 1005. Other methods of advancing the cleaning pad, including, but not limited to, those discussed with respect to FIGS. 4 and 5, may also be employed. For any given method of advancing the cleaning pad, the person of ordinary skill in the art is able to design a suitable cartridge, and method and structure for connecting to a drive motor, without undue experimentation.

Window 1004 should be dimensioned as appropriate by those of ordinary skill in the art to permit access by the probe tips on a probe card to the cleaning surface of the cleaning pad exposed in the window. It is contemplated that a window of about 1 inch×1 inch (about 2.5 cm×2.5 cm) should be appropriate for most applications. Other window sizes may be used.

In an embodiment of the invention, a backing surface (such as discussed with respect to FIG. 3) may be included that is permanently or releasably attached to the cartridge. In this embodiment, it is suitable, e.g., to attach the backing surface to the frame of the window, or beneath the window. In embodiments at least a portion of the backing surface is in alignment with the window.

Figure 11:
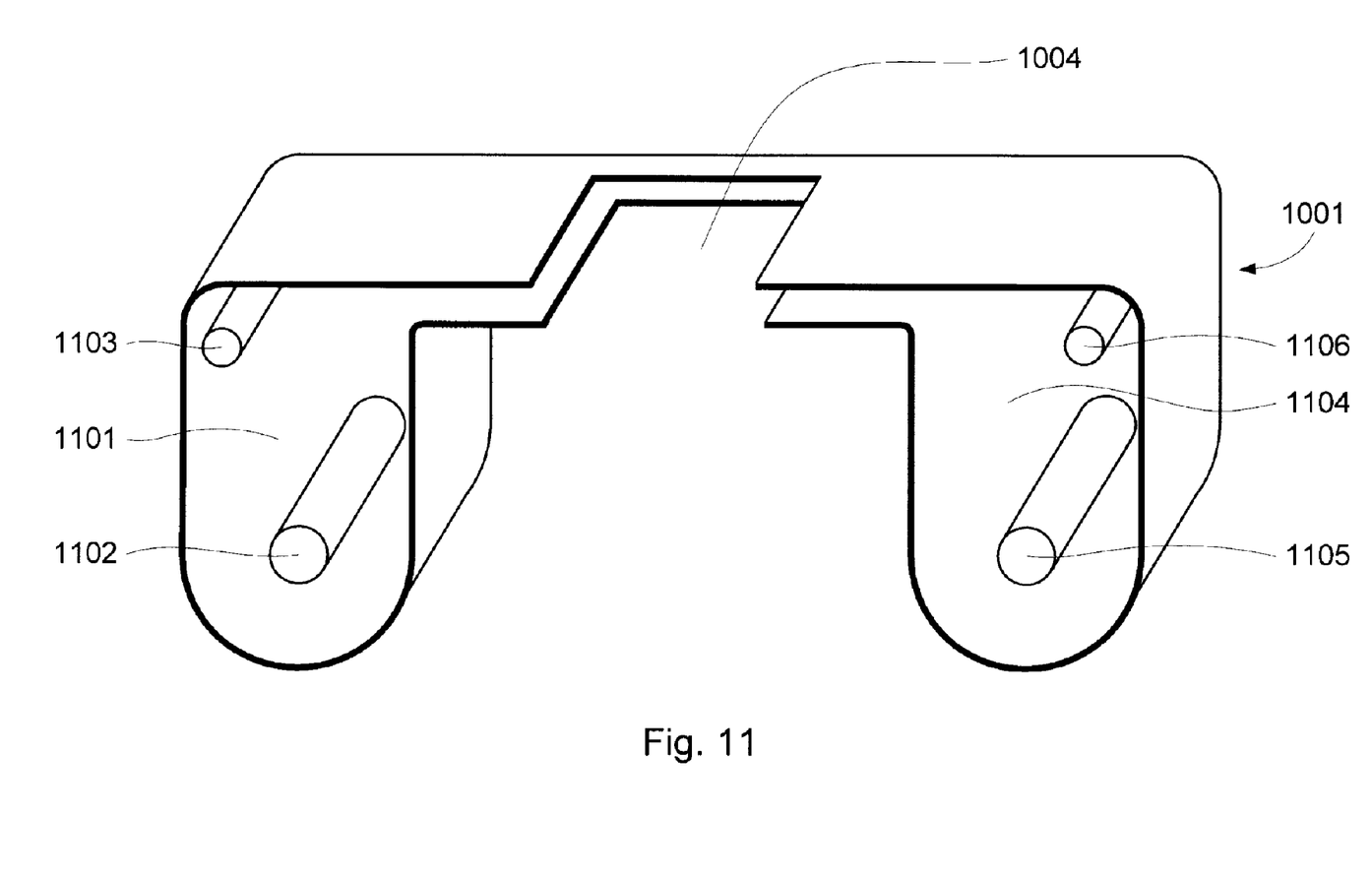
FIG. 11 is a cutaway view of the cartridge of FIG. 10 in accordance with the invention.

FIG. 11 schematically illustrates a cutaway view of the cartridge of FIG. 10. The interior of the cleaning pad supply portion 1101 contains spindles 1102 and 1103. The interior of the cleaning pad take-up portion 1104 contains spindles 1105 and 1106. In this aspect, the yet unused cleaning pad (not shown) is wound on spindle 1102 and passes over spindle 1103, through window 1004, over spindle 1106, and then wound up on spindle 1105. It should be recognized that the use of the spindle 1105 may be eliminated, with the use of the receptacle in its place, for example.

The overall dimensions of the cartridge are not critical to the invention. Factors affecting the dimensions include the width of the cleaning pad needed; whether a backing surface is made part of the cartridge; and if used, the method and structure for providing tension to the cleaning pad. In an aspect the cartridge may be, e.g., about 4 inches (about 10 cm) long and about 3 inches (about 7.6 cm) high.

Suitable dimensions of the spindles can be determined by those of ordinary skill in the art without undue experimentation. It should be understood that appropriate dimensions should be chosen so as not to damage unused portions of the cleaning pad, or to cause any other undesired behavior. It is contemplated that spindle 1102 should be of a sufficient diameter to prevent folding, buckling, or severe curling of the cleaning pad. It is contemplated that when the cleaning pad comprises an abrasive (such as sandpaper), an appropriate spindle diameter could be greater than or about equal to, 1 inch (about 2.5 cm).

Spindles 1102 and 1105 may be used to provide tension in the cleaning pad to help keep it substantially flat. It will be appreciated that spindles 1103 and 1106 may or may not be capable of rotating. Cartridges can also be designed employing any of the other methods of providing tension, such as, but not limited to, method as described above and illustrated in FIGS. 4-8. In aspects, a first tensioner is provided in or near the cleaning pad supply portion, and is positioned and arranged to apply tension to the cleaning pad in an area before the window. In aspects, a second tensioner is provided in or near the cleaning pad take-up portion, and is positioned and arranged in order to apply tension in an area after the window. In aspects, the first and second tensioner pull the cleaning pad in opposite directions in order to provide tension in the area between the two tensioners.

Figure 12:
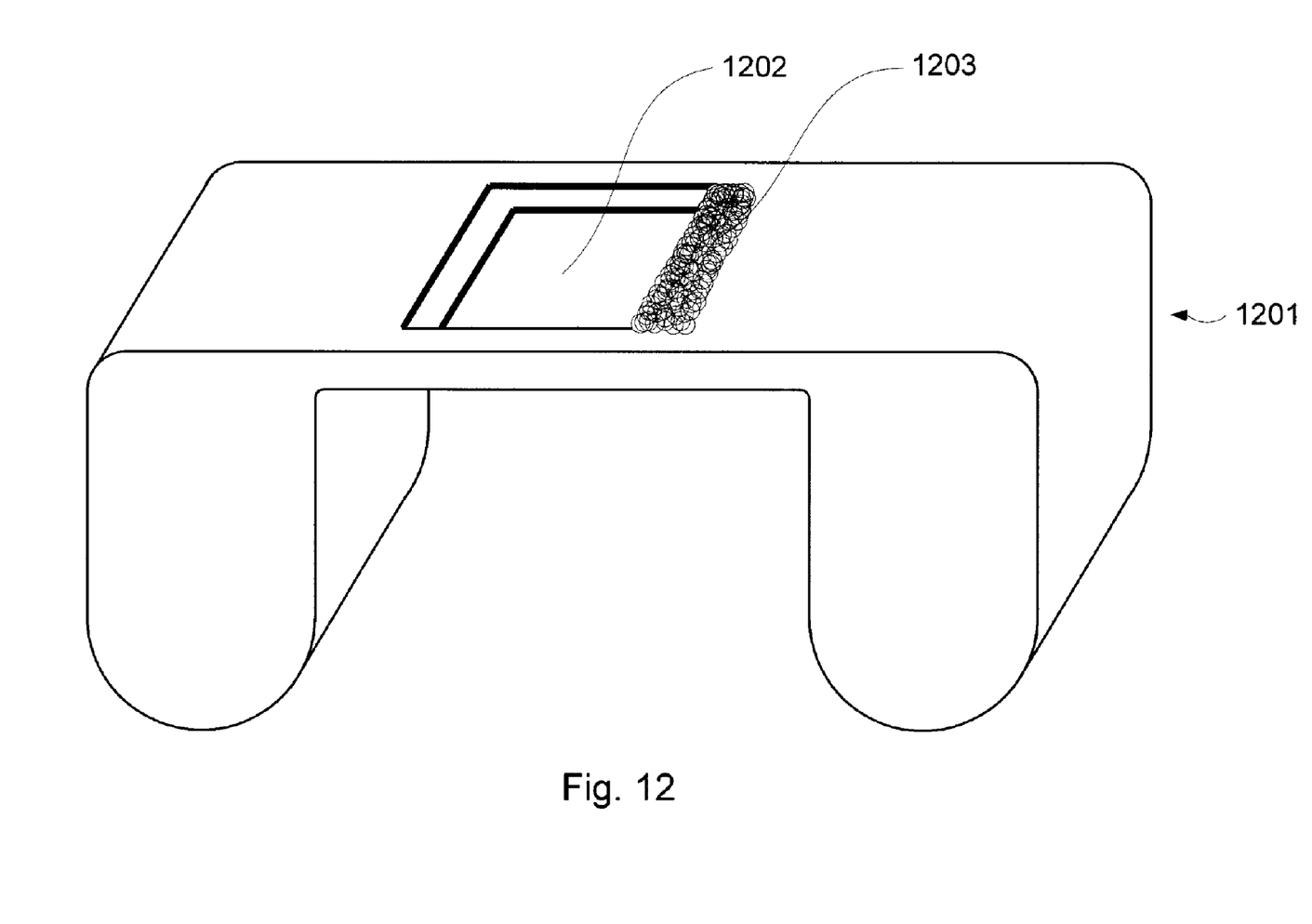
FIG. 12 is an alternative cartridge in accordance with the invention.

Another embodiment of the invention is shown in FIG. 12, which shows cartridge that comprises window 1202, and probe brush 1203 proximate the window. In this embodiment, it is possible to use a single vacuum to serve as both scrubber vacuum and probe brush vacuum. Other combinations of vacuum are also possible. Thus, in aspects, a single vacuum may serve as both backing surface vacuum and scrubber vacuum, or as both backing surface vacuum and probe brush vacuum. In aspects, it is also possible that a single vacuum can serve as all three of scrubber vacuum, probe brush vacuum, and backing surface vacuum.

It will be understood that the body of the cartridges can be made of any suitable materials. In aspects, the cartridges may be made of polymeric materials (e.g., thermoplastic and/or thermoset polymers), metal (e.g., aluminum and/or steel), composites (e.g., fiber reinforced resins), and combinations thereof. Suitable materials and methods for making the cartridge may be determined by the person of ordinary skill in the art without undue experimentation.

In aspects of the invention, any motors, vacuums, or other devices to used in conjunction with the present invention may be controlled by software in, e.g., the wafer prober. An operator of the prober may have control over various parameters, such as frequency and duration of cleaning, strength of the vacuum(s), etc. In aspects, these and other parameters may be controlled by a wafer prober operator via menu options in the wafer prober interface.

While the invention has been described in terms of embodiments, those skilled in the art will recognize that the invention can be practiced with modifications within the spirit and scope of the appended claims.

What is claimed is:

1. A cartridge comprising a cleaning pad, a cleaning pad supply portion, a cleaning pad take-up portion, the cartridge being designed and configured to fit into a cleaning portion of a wafer prober, and a window in a surface of the cartridge and positioned between the cleaning pad supply portion and cleaning pad take-up portion, the window being positioned and arranged to permit access to a portion of a cleaning surface of the cleaning pad.

2. The cartridge of claim 1, further comprising a tensioner structured to place tension on the cleaning pad.

3. The cartridge of claim 2, wherein the tensioner is one of a pinch roller and opposing arms.

4. The cartridge of claim 1, further comprising a scrubber vacuum positioned and arranged to aspirate material on a contact pad.

5. The cartridge of claim 1, further comprising a vacuum for drawing the cleaning pad toward a backing surface.

6. The cartridge of claim 1, further comprising a pair of rollers to maintain a tension in the cleaning pad.

7. The cartridge of claim 1, further comprising opposing non-rolling members to squeeze and provide a level of tension to the cleaning pad.

8. The cartridge of claim 1, wherein the cleaning pad take-up portion is a pair of rollers.

9. The cartridge of claim 1, further comprising a brush adapted to brush a probe tip of the wafer prober.

10. A cartridge comprising a cleaning pad attachable between a cleaning pad supply portion and a cleaning pad take-up portion, the cartridge being designed and configured to fit into a cleaning portion of a wafer prober, and a brush positioned between the cleaning pad supply portion and the cleaning pad take-up portion and positioned and adapted to brush a probe tip of the wafer prober.

11. The method of claim 10, further comprising a brush vacuum positioned and adapted to aspirate material from the brush.

12. A cartridge comprising a cleaning pad attachable between a cleaning pad supply portion and a cleaning pad take-up portion, the cartridge being designed and configured to fit into a cleaning portion of a wafer prober, and a backing surface positioned such that a portion of the cleaning pad is between a window and the backing surface, wherein the backing surface is substantially planar and is provided with a plurality of openings.

13. The cartridge of claim 12, wherein at least one of the cleaning pad supply portion and the cleaning pad take-up portion is a rotatable spindle.

14. A probe cleaning apparatus comprising:
a cleaning pad supply portion and a cleaning pad take-up portion;
a cleaning pad wound at least on the cleaning pad supply portion and dispensed in the cleaning pad take-up portion during use;
a scrubber vacuum positioned and arranged to aspirate material dislodged by the cleaning pad;
a backing surface having at least a portion adjacent to the cleaning pad;
a brush adapted and configured to brush a probe tip of a probe test apparatus; and
a brush vacuum positioned and arranged to aspirate material from the brush.

15. The probe cleaning apparatus of claim 14, further comprising a tensioner structured to place tension on the cleaning pad.

16. A probe cleaning apparatus comprising:
a cleaning pad supply portion and a cleaning pad take-up portion;
a cleaning pad wound at least on the cleaning pad supply portion and dispensed in the cleaning pad take-up portion during use;
a scrubber vacuum positioned and arranged to aspirate material dislodged by the cleaning pad;
a backing surface having at least a portion adjacent to the cleaning pad; and
a window positioned between the cleaning pad supply portion and the cleaning pad take-up portion to provide access to the cleaning pad.

17. A probe cleaning apparatus comprising:
a cleaning pad supply portion and a cleaning pad take-up portion;
a cleaning pad wound at least on the cleaning pad supply portion and dispensed in the cleaning pad take-up portion during use;
a scrubber vacuum positioned and arranged to aspirate material dislodged by the cleaning pad; and
a backing surface having at least a portion adjacent to the cleaning pad,
wherein the backing surface is substantially planar, and
the backing surface is provided with a plurality of openings, the apparatus further comprising a backing surface vacuum for drawing the cleaning pad toward the backing surface.

18. A method of cleaning a probe tip comprising contacting a probe tip with a surface of a cleaning pad, abrading the probe tip with the cleaning pad, advancing the cleaning pad in a direction parallel to the surface of the cleaning pad, and contacting the probe tip with a brush to dislodge, and vacuuming material from the brush.

19. The method of claim 18, further comprising operating a scrubber vacuum positioned and arranged to aspirate material dislodged by the abrading.

20. The method of claim 18, further comprising operating a backing surface vacuum for drawing the cleaning pad toward the backing surface.

* * * * *